(12) United States Patent
Mikami et al.

(10) Patent No.: US 10,199,343 B2
(45) Date of Patent: Feb. 5, 2019

(54) UBM (UNDER BUMP METAL) ELECTRODE STRUCTURE FOR RADIATION DETECTOR, RADIATION DETECTOR AND PRODUCTION METHOD THEREOF

(71) Applicant: JX NIPPON MINING & METALS CORPORATION, Tokyo (JP)

(72) Inventors: Makoto Mikami, Ibaraki (JP); Kouji Murakami, Ibaraki (JP); Akira Noda, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 15/705,421

(22) Filed: Sep. 15, 2017

(65) Prior Publication Data

US 2018/0061792 A1 Mar. 1, 2018

Related U.S. Application Data (63) Continuation of application No. PCT/JP2015/080595, filed on Oct. 29, 2015.

(30) Foreign Application Priority Data

Mar. 31, 2015 (JP) ................. 2015-073144

(51) Int. Cl.
*H01L 21/00* (2006.01)
*H01L 23/00* (2006.01)
(Continued)

(52) U.S. Cl.
CPC ............. *H01L 24/05* (2013.01); *G01T 1/24* (2013.01); *G01T 1/241* (2013.01); *H01L 24/03* (2013.01);
(Continued)

(58) Field of Classification Search
CPC ... H01L 24/05; H01L 24/03; H01L 27/14661; H01L 27/14659; H01L 27/14634;
(Continued)

(56) References Cited

U.S. PATENT DOCUMENTS 7,320,937 B1 * 1/2008 Pal .................. H01L 24/11
257/E21.174
2004/0104351 A1 6/2004 Shibayama
(Continued)

FOREIGN PATENT DOCUMENTS

JP H03-036744 A 2/1991
JP H03-201487 A 9/1991
(Continued)

OTHER PUBLICATIONS

English translation of the Written Opinion of the International Searching Authority for International Application No. PCT/JP2015/080595 previously dated Sep. 15, 2017.
(Continued)

*Primary Examiner* — Vu A Vu
(74) *Attorney, Agent, or Firm* — Hauptman Ham, LLP (57) ABSTRACT

An UBM electrode structure body for a radiation detector and a radiation detector arranged with the UBM electrode structure body are provided for suppressing peeling and having high electrode adhesion. In addition, a manufacturing method of an UBM electrode structure body for a radiation detector and a manufacturing method of a radiation detector using the UBM electrode structure body are provided in which peeling does not occur during UBM structure formation, a solder bonding process or bonding of a signal line to a Pt layer. The UBM electrode structure body for a radiation detector of the present invention is arranged with a CdTe substrate or CdZnTe substrate and a Pt electrode layer arranged on the CdTe substrate or CdZnTe substrate, adhe-
(Continued)

sion of the Pt electrode layer with respect to the CdTe substrate or the CdZnTe substrate being 0.5 N/cm or more.

9 Claims, 9 Drawing Sheets

(51) Int. Cl.
| | | |
|---|---|---|
| *G01T 1/24* | (2006.01) | |
| *H01L 31/00* | (2006.01) | |
| *H01L 27/144* | (2006.01) | |
| *H01L 27/146* | (2006.01) | |
| *H01L 31/08* | (2006.01) | |
| *H01L 31/10* | (2006.01) | |

(52) U.S. Cl.
CPC .......... *H01L 27/144* (2013.01); *H01L 27/146* (2013.01); *H01L 27/1469* (2013.01); *H01L 27/14634* (2013.01); *H01L 27/14636* (2013.01); *H01L 27/14659* (2013.01); *H01L 27/14661* (2013.01); *H01L 27/14696* (2013.01); *H01L 31/00* (2013.01); *H01L 31/08* (2013.01); *H01L 31/10* (2013.01); *H01L 2224/03464* (2013.01); *H01L 2224/0401* (2013.01); *H01L 2224/05083* (2013.01); *H01L 2224/05144* (2013.01); *H01L 2224/05155* (2013.01); *H01L 2224/05169* (2013.01); *H01L 2924/10373* (2013.01); *H01L 2924/10378* (2013.01); *H01L 2924/12043* (2013.01); *H01L 2924/1433* (2013.01)

(58) Field of Classification Search
CPC ......... H01L 27/14636; H01L 27/14696; H01L 27/1469; H01L 2924/12043; H01L 2924/10378; H01L 2924/10373; H01L 2224/05169; H01L 2224/05155; H01L 2224/05144; H01L 2224/05083; H01L 2224/0401; H01L 2924/1433; H01L 2224/03464; G01T 1/241
USPC .......................................................... 438/67
See application file for complete search history.

(56) References Cited

U.S. PATENT DOCUMENTS

| | | | |
|---|---|---|---|
| 2011/0210262 A1* | 9/2011 | Prendergast | ............ G01T 1/247 250/394 |
| 2013/0126999 A1* | 5/2013 | Rusian | .................. H01L 31/085 257/428 |

FOREIGN PATENT DOCUMENTS

| | | |
|---|---|---|
| JP | H03-248578 A | 11/1991 |
| JP | H07-038132 A | 2/1995 |
| JP | H08-125203 A | 5/1996 |
| JP | 2001-177141 A | 6/2001 |
| JP | 2003-142673 A | 5/2003 |
| JP | 2010-098329 A | 4/2010 |
| JP | 2013-157494 A | 8/2013 |

OTHER PUBLICATIONS

International Search Report dated Dec. 22, 2015 for International Patent Application No. PCT/JP2015/080595.
Written Opinion of the International Searching Authority dated Dec. 22, 2015 for International Patent Application No. PCT/JP2015/080595.

\* cited by examiner

UBM (UNDER BUMP METAL) ELECTRODE STRUCTURE FOR RADIATION DETECTOR, RADIATION DETECTOR AND PRODUCTION METHOD THEREOF

CROSS REFERENCE TO RELATED APPLICATIONS

This application is based upon and claims the benefit of priority from the prior Japanese Patent Application No. 2015-073144, filed on Mar. 31, 2015, and PCT Application No. PCT/JP2015/080595, filed on Oct. 29, 2015, the entire contents of which are incorporated herein by reference.

FIELD

The present invention is related to an UBM electrode structure body for a radiation detector, a radiation detector arranged with the UBM electrode structure body and a method of manufacturing the UBM electrode structure body and radiation detector. In particular, the present invention is related to an UBM electrode structure body for a CdTe-based radiation detector, more specifically, a UBM electrode structure body for a radiation detector including a CdTe substrate or CdZnTe substrate, a radiation detector arranged with the UBM electrode structure body and a method of manufacturing the UBM electrode structure body and radiation detector.

BACKGROUND

Conventionally, the development of a high efficiency, high resolution and small scale direct conversion type compound semiconductor for use in a radiation detector element is progressing. Among these semiconductors, attention in recent years is paid to cadmium telluride (CdTe), cadmium selenium telluride (CdSeTe), cadmium zinc telluride (CdZnTe), and cadmium zinc selenium telluride (CdZnSeTe), which are II-VI compound semiconductors as powerful materials. These are referred to below as CdTe-based semiconductors. Compared to semiconductors such as silicon (Si) or germanium (Ge), these semiconductors have the advantage of (1) a high detection efficiency of radiation due to a relatively large atomic number, and (2) a cooling device is not necessary since the effect of a thermal noise current is small because the band gap is large. When radiation incidents while applying an electric field to a semiconductor attached with electrodes, electrons and holes are generated in the semiconductor and proceed in mutually opposite directions along the applied electric field. In this way, radiation is detected by extracting the induced current as a signal.

Conventionally, vacuum deposition or plating and the like are known as methods of forming a metal electrode for connecting a circuit to the surface of a CdTe substrate or CdZnTe substrate. Recently, electroless plating is often used to form a gold electrode or a platinum electrode by immersing a CdZnTe substrate in a plating solution containing chloroauric acid or chloroplatinic acid, and depositing gold or platinum or alloys thereof to certain sections of the substrate surface (see Japanese Laid Open Patent Publication No. 2003-142673, Japanese Laid Open Patent Publication No. 2001-177141, Japanese Laid Open Patent Publication No. H08-125203, Japanese Laid Open Patent Publication No. H07-038132, Japanese Laid Open Patent Publication No. H03-248578 and Japanese Laid Open Patent Publication No. H03-201487).

Pt is suitably used in the case of forming a radiation detector using this type of CdTe-based semiconductor. Furthermore, although a solder is used depending on the process when a signal line for extracting a signal from an electrode is bonded, so as not to degrade characteristics by permeating the solder through the Pt layer as far as the CdTe-based semiconductor part and does not, a means is adopted for controlling the permeation of the solder by forming a thick Ni layer above a Pt electrode and forming a thin Au layer above the Ni layer (Under Bump Metal: UBM). A means such as plating or sputtering is used in the formation of a Pt layer and UBM structure.

However, when forming an UBM structure above a Pt layer, peeling occurs when forming the UBM structure in the case where adhesion between a CdTe-based semiconductor and the Pt layer is insufficient, and even when formed, peeling of the electrode sometimes occurs during the solder jointing process. In addition, although direct bonding of a signal line to a Pt layer using a metal with a low melting point such as In or by Au wire bonding is performed without using the UBM structure, peeling at the time of bonding the signal line sometimes occurs since adhesion between a CdTe-based semiconductor and Pt layer is weak.

SUMMARY

The present invention solves the problems of the conventional technology as described above by providing an UBM electrode structure body for a radiation detector and a radiation detector arranged with the UBM electrode structure body which suppresses peeling and has high electrode adhesion. In addition, a manufacturing method of an UBM electrode structure body for a radiation detector and a manufacturing method of a radiation detector arranged with the UBM electrode structure body are provided in which peeling does not occur during UBM structure formation, a solder jointing process or bonding of a signal line to a Pt layer.

According to one embodiment of the present invention, an UBM electrode structure body for a radiation detector is provided including a CdTe substrate or CdZnTe substrate, and a Pt electrode layer arranged on the CdTe substrate or the CdZnTe substrate. Adhesion of the Pt electrode layer with respect to the CdTe substrate or the CdZnTe substrate is 0.5 N/cm or more.

In the UBM electrode structure body for the radiation detector, adhesion of the Pt electrode layer with respect to the CdTe substrate or the CdZnTe substrate may be 3.93 N/cm or more.

In the UBM electrode structure body for the radiation detector, oxygen content measured using an X-ray photoelectron spectroscopy method of the outer-most surface of the CdTe substrate or the CdZnTe substrate before forming the Pt electrode layer may be less than 40 atm %.

In the UBM electrode structure body for the radiation detector, the CdTe substrate or the CdZnTe substrate may include impurities for controlling conductivity.

In the UBM electrode structure body for the radiation detector, the UBM electrode structure body for a radiation detector may be an electrode body having an UBM structure including a Ni layer above the Pt electrode layer with respect to the CdTe substrate or the CdZnTe substrate, and may further include an Au layer above the Ni layer.

In addition, according to one embodiment of the present invention, a radiation detector is provided including a radiation detector element formed by any one of the UBM electrode structure bodies for the radiation detector described above, and a detection circuit arranged via a bump in the Pt electrode layer.

According to one embodiment of the present invention, a method of manufacturing an UBM electrode structure body for a radiation detector is provided including preparing a CdTe substrate or CdZnTe substrate, sequentially performing methanol washing and acetone washing of the CdTe substrate or the CdZnTe substrate, washing the CdTe substrate or the CdZnTe substrate using a solvent comprised from hydrocarbons with a carbon number of 9 or more and 12 or less and containing no hydroxyl group, and forming a Pt electrode layer by electroless plating.

In the method of manufacturing the UBM electrode structure body for a radiation detector, the CdTe substrate or the CdZnTe substrate may include impurities for controlling conductivity.

In the method of manufacturing the UBM electrode structure body for a radiation detector, the electroless plating may be performed by immersing the CdTe substrate or the CdZnTe substrate in 0.01% by weight or more and 0.1% by weight or less of a chloroplatinic acid aqueous solution while stirring the chloroplatinic acid aqueous solution heated to 45° C. or more and 55° C. or less.

In the method of manufacturing the UBM electrode structure body for a radiation detector, the CdTe substrate or the CdZnTe substrate may be etched with a bromine-methanol mixed solution or a bromine-bromic acid aqueous solution mixed solution, and the Pt electrode layer may be formed by the electroless plating.

In the method of manufacturing the UBM electrode structure body for a radiation detector, a Ni layer may be formed above the Pt electrode layer with respect to the CdTe substrate or the CdZnTe substrate, and may be further formed with an Au layer above the Ni layer to form an electrode body having an UBM structure.

According to one embodiment of the present invention, a method of manufacturing a radiation detector is provided including cutting the CdTe substrate or the CdZnTe substrate including the UBM electrode structure body for a radiation detector manufactured by any one of the manufacturing methods described above to a predetermined shape to form a radiation detection element, and connecting a detection circuit to the Pt electrode layer of the radiation detection element via a bump.

REFERENCE SIGNS LIST

11: Metal Electrode, 13: Electrode Layer, 20: Substrate, 100: UBM Electrode Structure Body for a Radiation Detector, 130: UBM Structure, 550: Integrated Circuit Substrate, 560: Electrode Layer, 570: Bump, 581: Terminal, 583: Resistor, 591: Condenser, 593: Amplifier, 595: Multi-Channel Analyzer, 1000: Radiation Detector

DESCRIPTION OF EMBODIMENTS

An UBM electrode structure body for a radiation detector, a radiation detector and a manufacturing method of the UBM electrode structure body and radiation detector related to the present invention are explained below while referring to the diagrams. The UBM electrode structure body for a radiation detector, the radiation detector and manufacturing method of the UBM electrode structure body and radiation detector of the present invention should not be interpreted as being limited to the content described in the embodiments and examples shown herein. Furthermore, in the drawings which refer to the present embodiment and examples described herein, the same reference symbols are attached to the same components or components having similar functions and repeated explanations of these components are omitted.

Figure 1A:
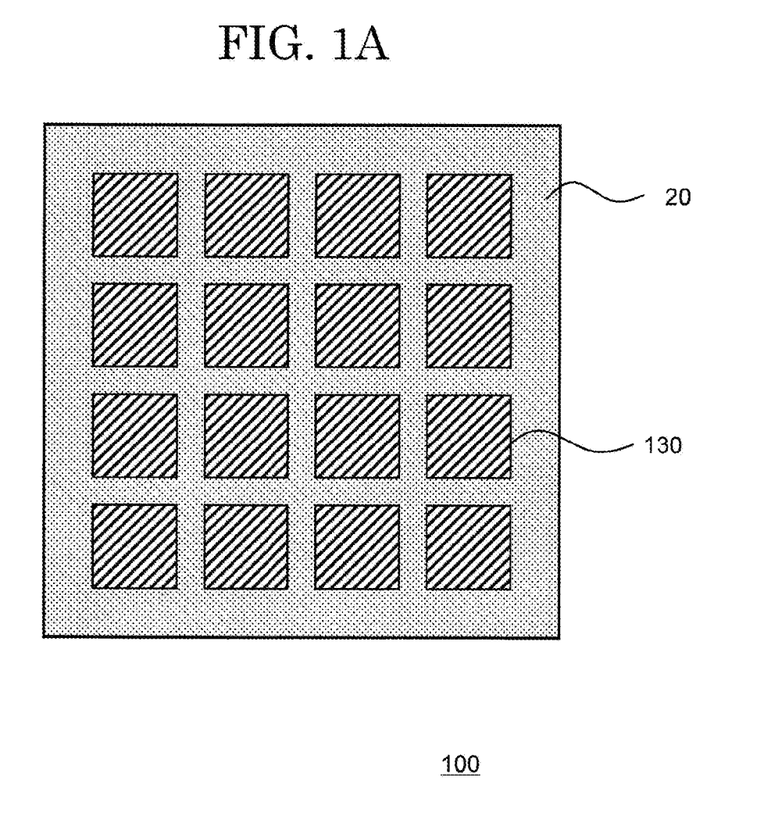
FIG. 1A is a schematic diagram showing an UBM electrode structure body for a radiation detector 100 used in a radiation detector related to one embodiment of the present invention and FIG. 1A is a top view of the UBM electrode structure body for a radiation detector 100.
Figure 1B:
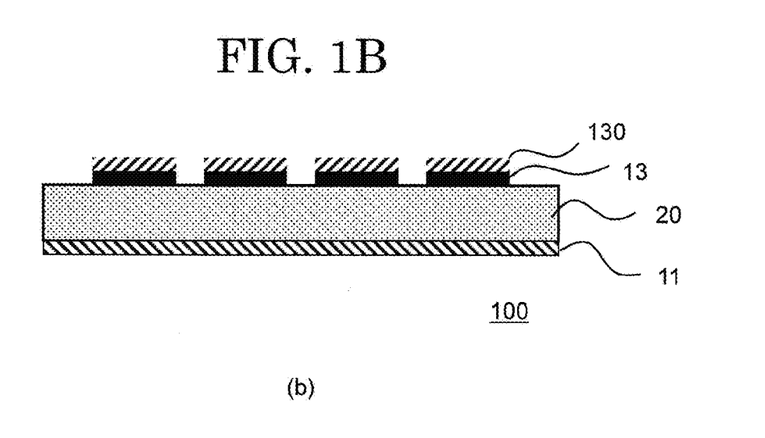
FIG. 1B is a side view of the UBM electrode structure body for a radiation detector 100.
Figure 2:
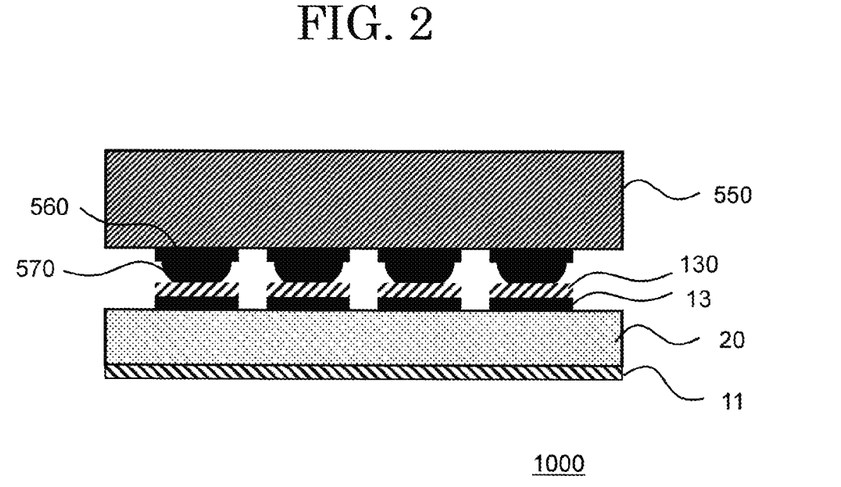
FIG. 2 is a side view of a radiation detector 1000 arranged with the UBM electrode structure body for a radiation detector 100 related to one embodiment of the present invention.

FIGS. 1A and 1B is a schematic diagram showing an UBM electrode structure body for a radiation detector 100 used in a radiation detector related to one embodiment of the present invention. FIG. 1A is a top view of the UBM electrode structure body for a radiation detector 100 and FIG. 1B is a side view of the UBM electrode structure body for a radiation detector 100. In addition, FIG. 2 is a side surface view of a radiation detector 1000 arranged with the UBM electrode structure body for a radiation detector 100.

The UBM electrode structure body for a radiation detector 100 is arranged with a substrate 20, a metal electrode 11 disposed in a first surface of the substrate 20 (lower surface of substrate 20 in FIG. 1B), and an electrode layer 13 disposed in a second surface of the substrate 20 (upper surface of substrate 20 in FIG. 1B) opposing the first surface. In addition, the UBM electrode structure body for a radiation detector 100 is disposed with a UMB (Under Bump Metal) layer 130 above the electrode layer 13. The metal electrode 11 is formed on the entire first surface of the substrate 20 for example. In addition, the electrode layers 13 are disposed in a matrix shape on the second surface of the substrate 20 for example. In addition, the radiation detector 1000 is arranged with an integrated circuit substrate 550 disposed with an electrode layer 560 (FIG. 2).

In the present invention, an UBM (Under Bump Metal) structure 130 is disposed on a surface connected with a bump 570 of the electrode layer 13 in order to prevent corrosion of the electrode layer 13 by the solder of the bump 570. In the present invention, the electrode layer 13 includes a Ni layer above the electrode layer 13 with respect to the substrate 20 and forms an electrode body including the UBM structure 130 which further includes an Au layer on the Ni layer. The electrode layer 13 of the radiation detection element 100 is connected with a corresponding electrode layer 560 disposed in the integrated circuit substrate 550 via the UBM structure 130 and bump 570.

(Electrode)

The metal electrode 11 and electrode layer 560 are formed by a thin film using a noble metal such as aurum (Au), platinum (Pt) or iridium (Ir). On the other hand, the electrode layer 13 is formed by a platinum (Pt) layer or aurum (Au) layer by electroless plating above the substrate 20 and platinum (Pt) can be favorably used. In the present embodiment, the metal electrode 11 is a common electrode and the electrode layer 13 is a pixel electrode. In addition, the electrode layer 560 corresponds to the electrode layer 13 and a current is received from the electrode layer 13 via the bump 570.

(Substrate)

The substrate 20 is a CdTe substrate or CdZnTe substrate. In addition, the substrate 20 may also include impurities for controlling conductivity. That is, the substrate 20 may be a substrate comprised from a CdTe substrate or CdZnTe substrate and may also be a substrate including impurities for controlling conductivity in the CdTe substrate or CdZnTe substrate. Although it is possible to give chorine (Cl) or indium (In) as examples of impurities for controlling conductivity, the present invention is not limited to these. The substrate 20 is formed in a thin plate shape and a main surface formed with the metal electrode 11 and electrode layer 13 for Example serves as a surface (111). Since crystal orientation [111] is a polar axis in CdZnTe, among the surfaces of the substrate 20, the surface composition on a second surface side has a high Cd ratio and the surface composition on a first surface side has a high Te ratio.

(Adhesion of an Electrode Layer)

The electrode layer 13 related to the present invention has adhesion to the substrate 20 of 0.5 N/cm or more and preferably 3.9 N/cm or more. This high adhesion of the electrode layer 13 to the substrate 20 is not obtained in a conventional UBM electrode structure body for a radiation detector. In the UBM electrode structure body for a radiation detector 100 related to the present invention having this high adhesion, there is no peeling even when the UBM structure 130 is formed. When adhesion to the substrate 20 is less than 0.5 N/cm, peeling easily occurs during UBM structure formation, a solder bonding process or during bonding of a signal line to a Pt layer which is undesirable. By providing the electrode layer 13 related to the present invention with sufficient adhesion to the substrate 20, peeling during UBM structure formation does not occur, and peeling of the electrode layer 13 also does not occur during bonding with the integrated circuit substrate 550 via the bump 570 using a solder bonding process.

(Oxygen Content in an Outer-Most Surface of the Substrate)

Although the electrode layer 13 is provided with high adhesion to the substrate 20 in the present invention, the inventors first discovered that this high adhesion is related to the oxygen content in an outer-most surface of the substrate 20 before formation of the electrode layer 13. In the UBM electrode structure body for a radiation detector 100 related to the present invention, the oxygen content in the outer-most surface of the substrate 20 before formation of the electrode layer 13 measured by an X-ray photoelectron spectroscopy method is less than 40 atm %. The oxygen content of the outer-most surface of the substrate 20 measured by an X-ray photoelectron spectroscopy method is related to the contained amount of a Te oxide, and when the oxygen content is 40 atm % or more, the surface of the substrate 20 becomes close to hydrophobicity and since bonding of the electrode layer 13 and the substrate 20 is weak when forming the electrode layer 13, adhesion of the electrode layer 13 drops and it becomes easier for the electrode layer 13 to peel from the substrate 20. On the other hand, since the UBM electrode structure body for a radiation detector 100 related to the present invention in which the oxygen content of the outer-most surface of the substrate 20 before formation of the electrode layer 13 measured by an X-ray photoelectron spectroscopy method is less than 40 atm % has a low contained amount of Te oxide in the outer-most surface of the substrate 20, hydrophilicity of a substrate surface improves, bonding of the electrode layer 13 and the substrate 20 when forming the electrode layer 13 is stronger and adhesion of the electrode layer 13 is improved.

Figure 3:
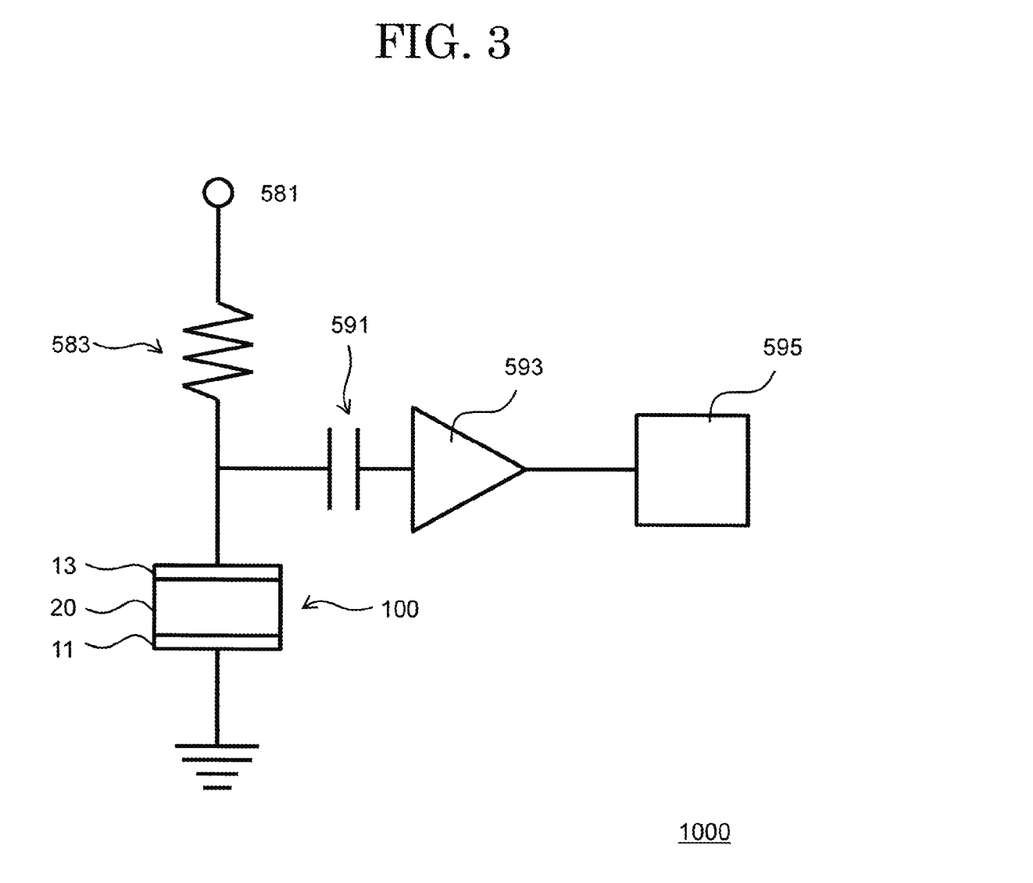
FIG. 3 is a circuit diagram of the radiation detector 1000 related to one embodiment of the present invention.

FIG. 3 is a circuit diagram of the radiation detector 1000 related to one embodiment of the present invention. In one embodiment, the radiation detector 1000 is formed from the UBM electrode structure body for a radiation detector 100, a condenser 591, an amplifier 593 and a multi-channel analyzer (MCA) 595 and the like. The UBM electrode structure body for a radiation detector 100 is applied with a predetermined bias voltage by the metal electrode 11 (common electrode) which is connected to ground and the electrode layer 13 (pixel electrode) which is connected to a negative potential terminal 581 via a resistor 583. In addition, the electrode layer 13 is connected to the MCA 595 via the condenser 591 and amplifier 593.

The integrated circuit substrate 550 is arranged with the condenser 591 and amplifier 593 and the like. When the substrate 20 receives radiation (hard X-rays or Y rays) and emits electrons, the electrons become an ionization current due to the bias voltage and the ionization current flow from the UBM electrode structure body for a radiation detector 100 to the integrated circuit substrate 550 via the electrode layer 13, bump 570 and electrode layer 13. The ionization current is converted to a pulse signal via the condenser 591 and amplifier 593, the pulse signal is analyzed by the multi-channel analyzer and a radiation spectrum is obtained.

In the present invention, by providing high adhesion between the electrode layer 13 and substrate 20, the electrode layer 13 does not peel from the substrate 20 even when forming the radiation detector 1000 using the UBM electrode structure body for a radiation detector 100.

(Manufacturing Method of Radiation Detector)

A manufacturing method of the radiation detector 1000 related to the embodiments is explained. Although the manufacturing method of the radiation detector 1000 includes a substrate manufacturing process, electrode formation process, dicing process and integrated circuit substrate connecting process for example, the present invention is not limited to these. FIGS. 4A to 4D and FIGS. 5A to 5B are schematic diagrams showing the manufacturing process of the radiation detector 1000 related to one embodiment of the present invention The substrate manufacturing process (FIG. 4A) is a process for preparing a CdTe substrate or CdZnTe substrate and a thin circular plate shaped substrate (wafer) is cut by cutting a single crystal ingot of CdTe or CdZnTe along the crystal surface (111) (cutting process). The cut surface (first surface disposed with the metal electrode 11 and second surface disposed with the electrode layer 13) of the cut substrate is physically mirror polished using a polishing agent such as aluminum powder (polishing process). The polishing process may be repeated a plurality of times for each substrate. In addition, a CdTe substrate or CdZnTe substrate added with chlorine or indium and the like may also be used.

For example, although it is possible to manufacture a Cd(Zn) Te single crystal by once synthesizing Cd, (Zn), Te, making a Cd(Zn)Te polycrystal, heating this to melting point or more and cooling to form a single crystal, it is possible to manufacture a crystal added with impurities for conductivity control by introducing an impurity single body or compound of impurities and a constituent element when synthesizing Cd(Zn)Te. For example, it is possible to use cadmium chloride ($CdCl_2$) in the case of adding chlorine, and an indium single body in the case of adding indium.

Figure 4A:
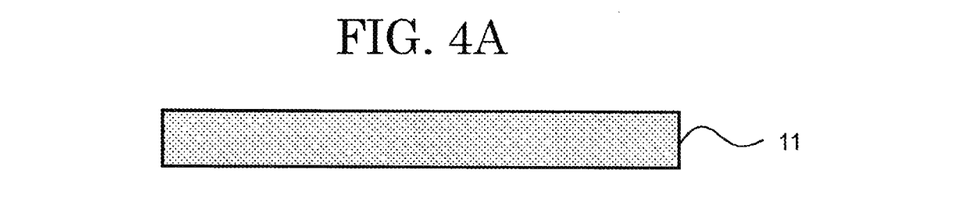
FIG. 4A is a schematic diagram showing the radiation detector 1000 related to one embodiment of the present invention.
Figure 4B:
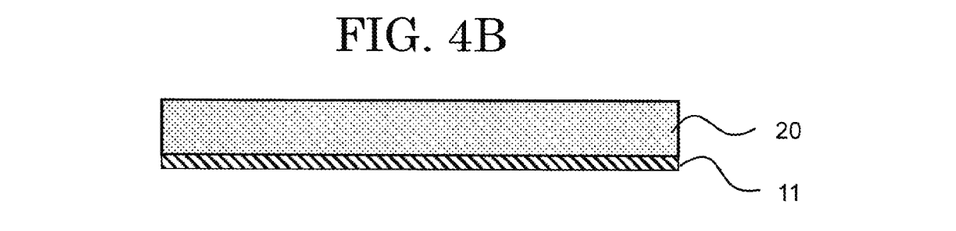
FIG. 4B is a schematic diagram showing the radiation detector 1000 related to one embodiment of the present invention.
Figure 4C:
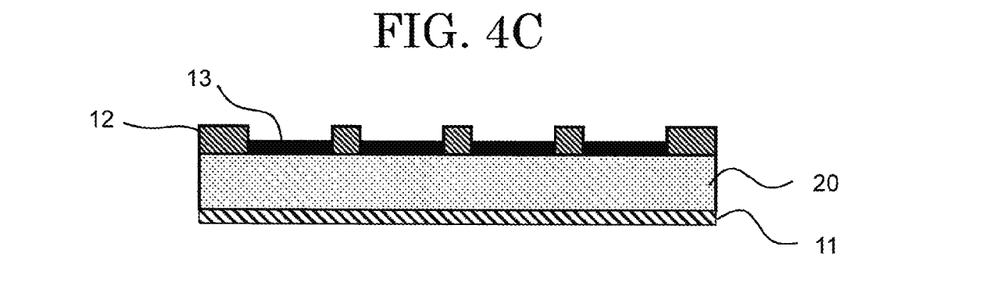
FIG. 4C is a schematic diagram showing the radiation detector 1000 related to one embodiment of the present invention.

In the electrode formation process, the metal electrode 11 is formed on a first surface of the substrate 20 (FIG. 4B), and the electrode layer 13 is formed on a second surface of the substrate 20 so as to oppose the metal electrode (FIG. 4C). In the electrode formation process, for example, the substrate 20 is immersed in methanol and foreign objects attached to the substrate 20 are removed by ultrasonic cleaning at room temperature. Furthermore, the substrate 20 is immersed in acetone and foreign objects attached to the substrate 20 are removed by ultrasonic cleaning at room temperature.

In the present invention, the substrate 20 after acetone cleaning is cleaned using a solvent comprised from hydrocarbons with a carbon number of 9 or more and 12 or less and containing no hydroxyl group so that the oxygen content of an outer-most surface of the substrate 20 measured by an X-ray photoelectron spectroscopy method with respect to at least an outer-most surface part of the substrate 20 which should be arranged with the electrode layer 13 becomes less than 40 atm %. In the present invention, by washing the substrate 20 using a solvent comprised from hydrocarbons with a carbon number of 9 or more and 12 or less and containing no hydroxyl group, the surface of the substrate 20 is sufficiently degreased, the contained amount of Te oxides in the outer-most surface of the substrate 20 decreases and it is possible to improve wettability of the surface of the substrate 20. In this way, adhesion of the electrode layer 13 to the substrate 20 is improved, and peeling of the electrode layer 13 during UBM structure formation, during a solder jointing process or during bonding of a signal line to the electrode layer 13 is more difficult to occur.

In one embodiment, in the case where the substrate 20 is cleaned using a solvent comprised from hydrocarbons with a carbon number of 9 or more and 12 or less and containing no hydroxyl group, it is preferred that the solvent comprised from hydrocarbons with a carbon number of 9 or more and 12 or less and containing no hydroxyl group is heated to a temperature range from 80° C. to 90° C. and that the substrate 20 is immersed in a range of 5 minutes or more and 10 minutes or less. When the solvent comprised from hydrocarbons with a carbon number of 9 or more and 12 or less and containing no hydroxyl group is used at room temperature without heating, sufficient cleaning effects cannot be obtained, and the contained amount of Te oxides in the outer-most surface of the substrate 20 cannot be sufficiently reduced.

Although it is possible to use Solfine (Registered Trademark) manufactured by Showa Denko Co, Ltd as a solvent comprised from hydrocarbons with a carbon number of 9 or more and 12 or less and containing no hydroxyl group in the present invention, the solvent is not limited to this. It is possible to use a coal tar naphtha solvent mainly including $C_9H_{12}$, trimethylbenzene, cumene or a mixed product of these. In addition, xylene may be further included. In addition, although cleaning effects are improved by longer cleaning at a temperature higher than the temperature range described above (up to an autoignition temperature of 470° C.) in the case where Solfine is used as the solvent comprised from hydrocarbons with a carbon number of 9 or more and 12 or less and containing no hydroxyl group, it is not preferred since the substrate 20 degrades due to heat.

A photo-resist is coated on the surface of the sufficiently washed substrate 20 and the photo-resist is exposed using a photo-mask drawn with pixel electrode pattern. Next, the light-struck photo-resist is removed by developing. Following this, for example, the substrate 20 is immersed in an etching solution mixed with hydrogen bromide, bromine and water, the polished surface of the substrate 20 is etched at room temperature and an affected layer is removed from the surface of the substrate 20. The etching solution is removed from the substrate 20 using methanol, the methanol is removed from the substrate using pure water and it is possible to form an electrode pattern 12.

Following this, the electrode layer 13 is formed in a section where the photoresist on the polished surface of the substrate 20 is removed by immersing the substrate 20 in a plating solution including a noble metal (electroless plating process). For example, by immersing the substrate 20 in a chloroplatinic acid solution obtained by mixing hydrochloric acid in a hexachloroplatinic (IV) acid hexahydrate compound as the plating solution, platinum (Pt) is deposited on the section where the photoresist on the polished surface of the substrate 20 is removed and the electrode layer 13 is formed to a film thickness of 0.05 μm or more and 0.10 μm or less. Although the concentration is 0.01% by weight or more and 0.1% by weight or less in one embodiment, the present invention is not limited to this. In addition, it is preferred that the plating solution is stirred so that the noble metal is deposited uniformly.

Furthermore, it is possible to use Hydrogen Tetrachloroaurate (III) Tetrahydrate as the plating solution in the case where the electrode layer 13 is formed using silver (Au).

Figure 4D:
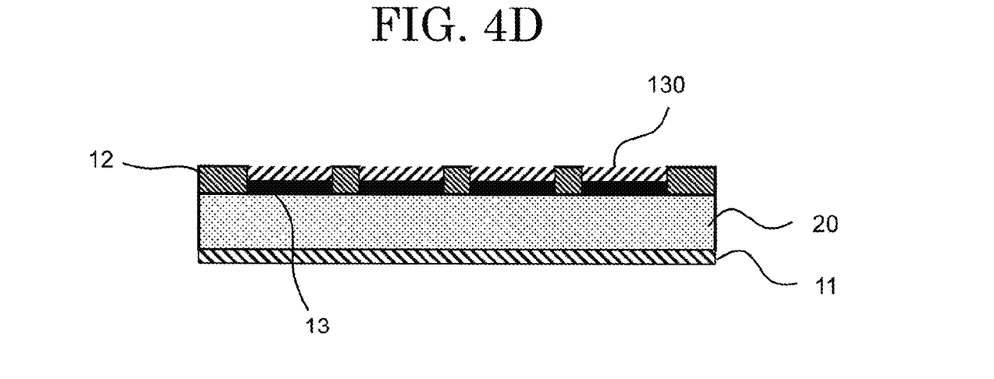
FIG. 4D is a schematic diagram showing the radiation detector 1000 related to one embodiment of the present invention.

The substrate 20 formed with the metal electrode 11 and electrode layer 13 is attached to a sputtering apparatus, a plasma is generated under an Ar gas atmosphere, a Ni target is sputtered to form a Ni layer with a film thickness of 0.2 μm or more and 0.6 μm or less above the electrode layer 13, an Au layer is formed above the Ni layer by switching to an Au target and the UBM structure 130 is formed (FIG. 4D).

Figure 5A:
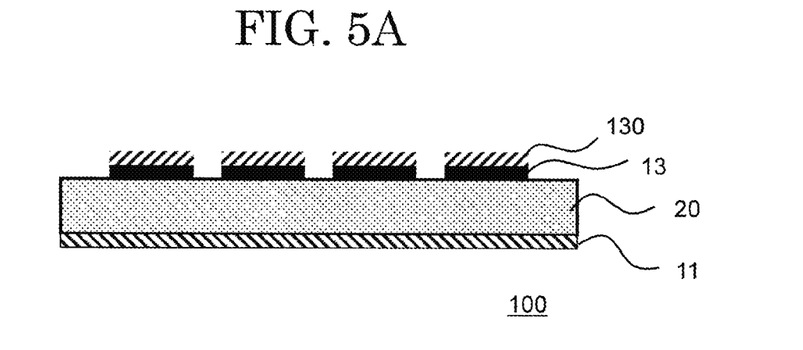
FIG. 5A is a schematic diagram showing a manufacturing process of the radiation detector 1000 related to one embodiment of the present invention.

The Ni layer and Au layer are also formed above resist remaining sections 12, the substrate 20 is immersed in a solvent such as acetone, the remaining resist 12 is peeled and the Ni layer and Au layer are lifted off from above the resist 12 by ultrasonic cleaning. The substrate 20 is washed using pure water and dried by blowing nitrogen gas for example onto the substrate 20, and the UBM electrode structure body for a radiation detector 100 arranged with an electrode body formed with the UBM structure 130 including an Au layer above a Ni layer on the electrode layer 13 is obtained (FIG. 5A).

Figure 5B:
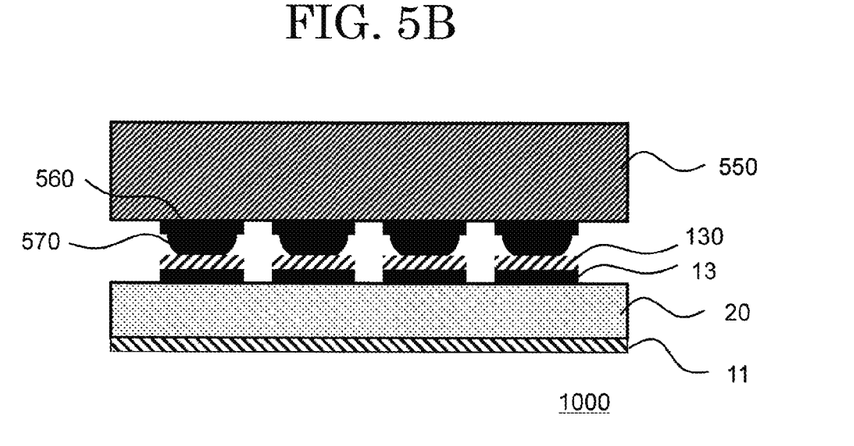
FIG. 5B is a schematic diagram showing a manufacturing process of the radiation detector 1000 related to one embodiment of the present invention.

Following this, the UBM electrode structure body for a radiation detector 100 is appropriately diced. Furthermore, because a known method can be used for the dicing process a detailed explanation is omitted. The electrode layer 13 arranged with the UBM structure 130 of the UBM electrode structure body for a radiation detector 100 is connected with the electrode layer 560 of the integrated circuit substrate 550 via the bump 570 (FIG. 5B). In this way, it is possible to manufacture the radiation detector 1000 related to the present embodiment.

As explained above, in the radiation detector related to the present embodiment, by cleaning a substrate using a solvent comprised from hydrocarbons with a carbon number of 9 or more and 12 or less and containing no hydroxyl group, the contained amount of Te oxides in the outer-most surface of the substrate decreases and it is possible to improve wettability of the substrate surface. In this way, it is possible to obtain sufficient adhesion of an electrode with respect to a substrate.

EXAMPLES

Example 1

According to the embodiment described above, using a 30 mm×30 mm CdZnTe substrate (111) having undergone a polishing process (mirror polishing), an affected layer formed by a polishing process was removed by immersing the CdZnTe substrate in 1% by volume of a bromine methanol solution and etching the substrate surface to 20 µm.
(Substrate Cleaning)
The CdZnTe substrate was immersed in methanol and cleaned using ultrasound at room temperature for 10 minutes. Following this, the CdZnTe substrate was immersed in acetone and cleaned using ultrasound at room temperature for 10 minutes. Next, after immersing the CdZnTe substrate in Solfine (Registered Trademark)—cleaner 1700 (Showa Denko Co. Ltd) at 80° C. for 5 minutes, the substrate was immersed in isopropyl alcohol (IPA) twice for 5 minutes each at room temperature and naturally dried.
(Formation of a Metal Electrode)
A CdZnTe substrate (111) was prepared, a photo-resist was coated on the surface of the CdZnTe substrate and a resist pattern with a film thickness of 3 µm was formed in an electrode patterned shape using photolithography. The CdZnTe substrate covered with the photo-resist film was etched using an etching solution mixed with bromine, hydrogen bromide and water at a mol concentration with a ratio of 1:50:50. Impurities present in exposed sections of the resist pattern formation surface of the substrate or an affected layer generated by a cutting process of the substrate were removed.

The substrate was immersed for 10 minutes in a bath with 0.1% by weight of a chloroplatinic acid aqueous solution obtained by dissolving a hexachloroplatinic (IV) acid hexahydrate compound and hydrochloric acid heated to 45° C. and a platinum (Pt) layer was formed to 50 nm by electroless plating. At this time, a water solution was continuously stirred so that non-uniformity was not produced during deposition of a platinum electrode. The platinum layer was not formed in the resist remaining sections and a platinum electrode pattern was formed.

Example 2

A CdZnTe substrate added with Cl at a concentration of 100 ppm was used as Example 2, and apart from using a bath with a plating solution heated to 55° C. in the formation of a platinum layer by electroless plating, a platinum electrode pattern was formed in the same manner as Example 1.

Comparative Example 1

As Comparative Example 1, apart from cleaning a substrate using only methanol and acetone and standing the substrate without stirring the water solution in the electroless plating process, a pattern electrode was formed in the same manner as Example 1 described above.

Comparative Example 2

A CdZnTe substrate cut from the same ingot as in Example 2 was used as Comparative Example 2 and a platinum electrode pattern was formed in the same manner as Comparative Example 1.
(Adhesion Evaluation)
With respect to the Pt electrodes formed in Example 1 and Example 2 and Comparative Example 1 and 2, after attaching Nitto Denko ELEP Masking N-380 (blue tape), it was visually confirmed whether the Pt electrode peeled away together with the tape by peeling the tape. The present experiment was performed in compliance with the implementation method described in JIS Z 1522 (cellophane adhesive tape). 10 specimens of the Pt electrodes used in the experiments in Example 1 and Example 2 were all held on a CdZnTe substrate and peeling was not observed. On the other hand, adhesion was less in the Pt electrodes formed in Comparative Examples 1 and 2 and peeled in all the specimens.

In addition, after attaching NICHIBAN CELLOTAPE (Registered Trademark) (No. 405) based on JIS Z 152, it was confirmed whether the Pt electrode peeled away together with the tape by peeling the tape. As a result, 8 specimens among the 10 Pt electrodes used in the experiments in Example 1 and Example 2 were all held above a CdZnTe substrate and peeling was not observed.

Adhesions with N-380 blue tape and NICHIBAN CELLOTAPE used in Examples 1 and 2 and Comparative Examples 1 and 2 were about 0.50 N/cm and 3.93 N/cm respectively, and it became clear that adhesion to a CdZnTe substrate of a Pt electrode formed in Examples 1 and 2 has a value of 0.50 N/cm or more and preferably 3.93 N/cm or more. In addition, as a result of separately study changing the type of tape used in the adhesion experiment with respect to a Pt electrode manufactured under the same conditions used in Comparative Examples 1 and 2, variance in adhesion in a range of 0.2 to 0.4 N/cm was observed in the Pt electrodes in Comparative Examples 1 and 2.
(Formation of UBM Structure)
A Pt electrode was manufactured using the same method as in Example 1 and Comparative Example 1 described above, a Ni layer with a film thickness of 500 nm and an Au layer with a film thickness of 50 nm were further formed by sputtering and 10 specimens of a UMB structure were manufactured. In the process of manufacturing this UBM structure, peeling of a Pt electrode was not observed. In addition, peeling of a Pt electrode was not observed even as a result of performing solder jointing to an UBM structure.

Similarly, a Ni layer with a film thickness of 500 nm and an Au layer with a film thickness of 50 nm were formed on a Pt electrode manufactured using the same method as in Comparative Example 1 by sputtering the same as described above, and 10 specimens of an UMB structure were manufactured. In the process of manufacturing this UBM structure, peeling of a Pt electrode was observed in 3 of the 10 specimens. In addition, peeling was observed in 1 specimen when performing solder jointing to the 7 specimens which did not peel at this point.

(Element Analysis by X-Ray Photoelectron Spectroscopy Method)

Figure 6:
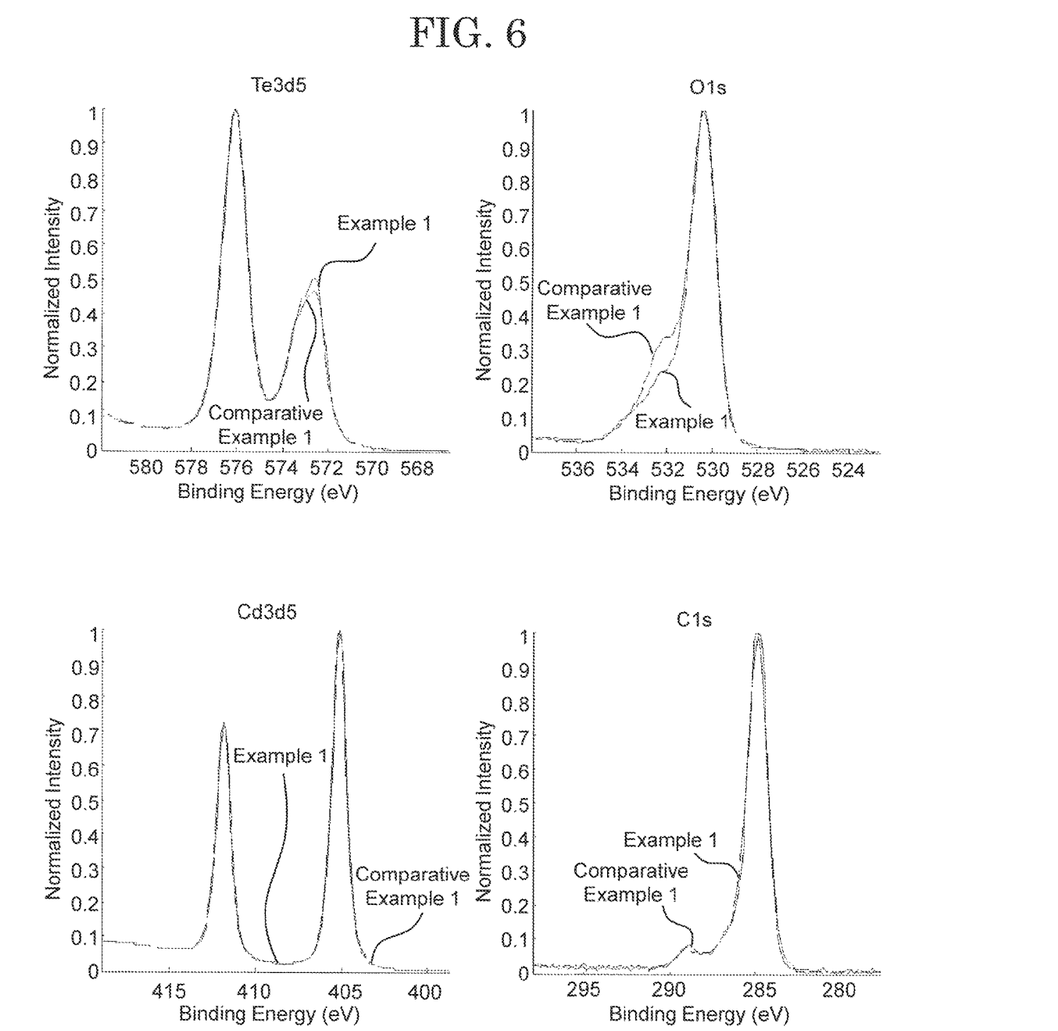
FIG. 6 is a spectrum of elements in an outer-most surface using an X-ray photoelectron spectroscopy method related to one embodiment of the present invention.
Figure 7:
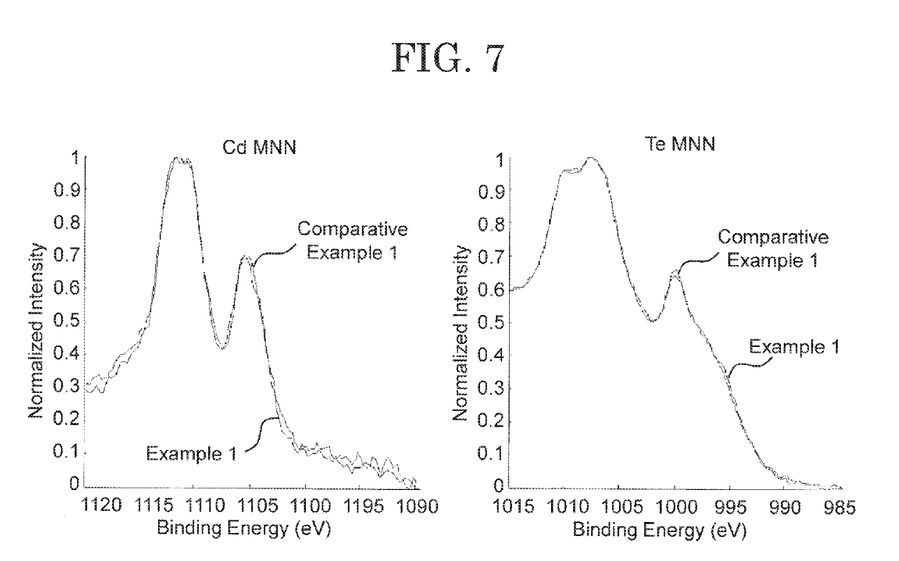
FIG. 7 is a spectrum of elements in an outer-most surface using an X-ray photoelectron spectroscopy method related to one embodiment of the present invention.
Figure 8:
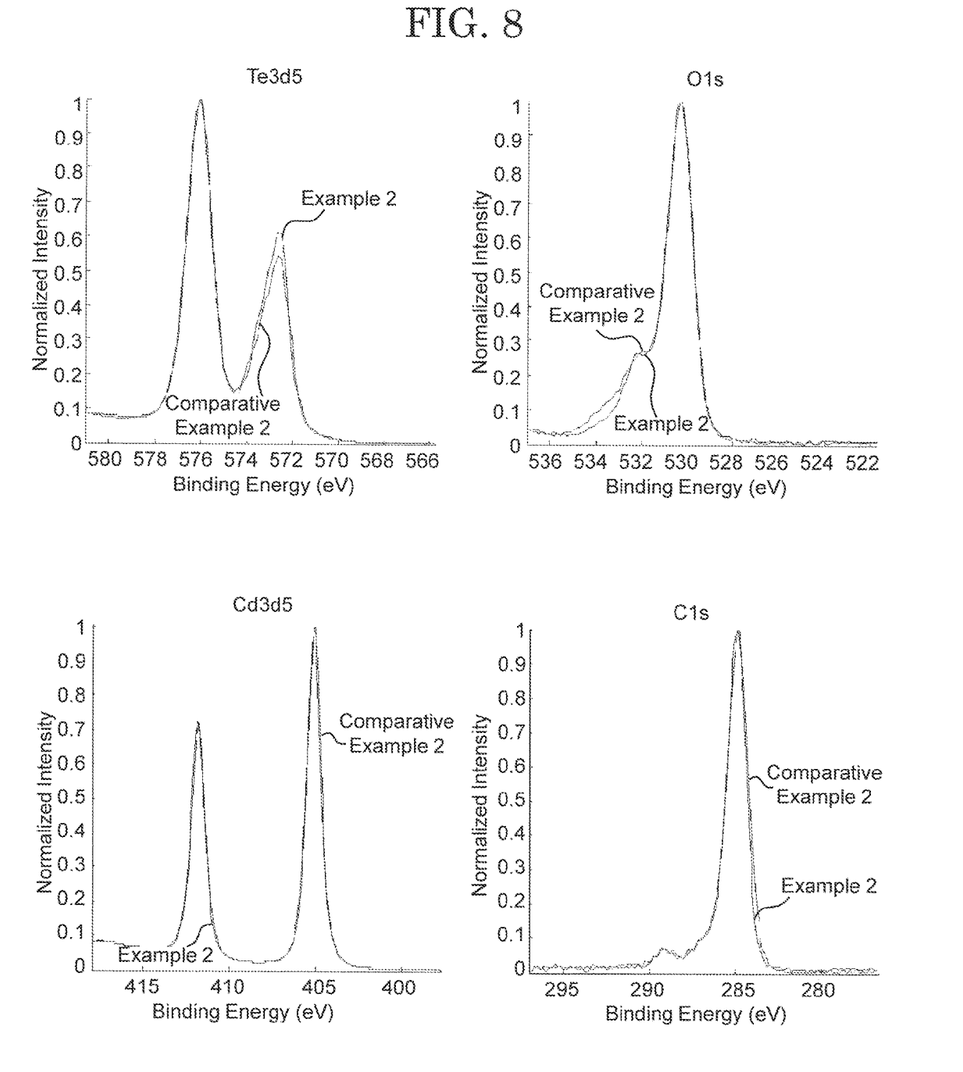
FIG. 8 is a spectrum of elements in an outer-most surface using an X-ray photoelectron spectroscopy method related to one embodiment of the present invention.
Figure 9:
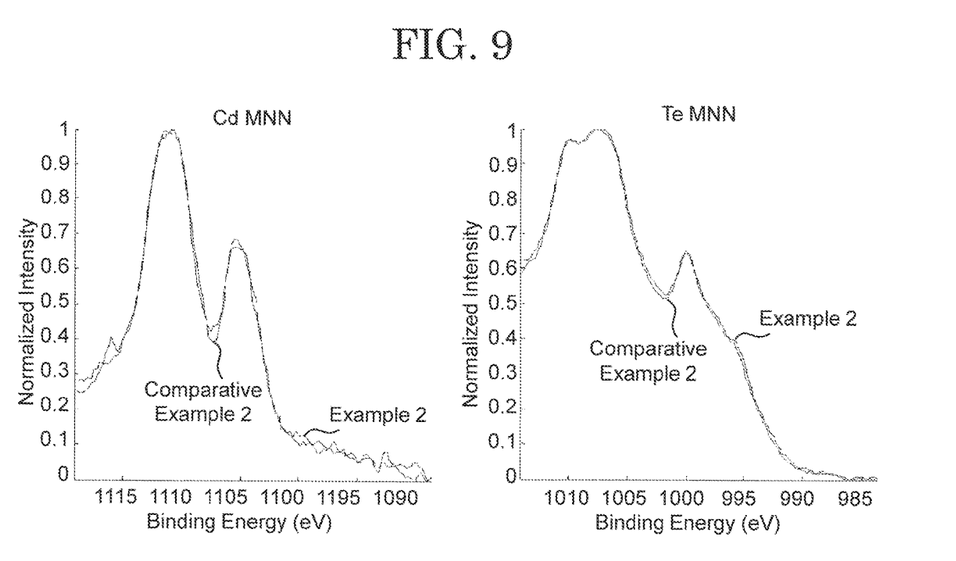
FIG. 9 is a spectrum of elements in an outer-most surface using an X-ray photoelectron spectroscopy method related to one embodiment of the present invention.

The process was stopped before formation of an electrode with respect to a CdZnTe substrate in Examples 1 and 2 and Comparative Examples 1 and 2, and an element analysis of an outer-most surface was performed using an X-ray photoelectron spectroscopy method. The element analysis was performed using a PHI5000 VersaPro II manufactured by ULVAC-PHI Inc. Carbon (C), oxygen (O), cadmium (Cd) and tellurium (Te) spectrums are shown in FIG. 6 to FIG. 9. A spectrum of Te3d5, O1s, Cd3d and C1s in Example 1 and Comparative Example 1 are shown in FIG. 6 and a spectrum of Cd MNN and Te MNN are shown in FIG. 7. In addition, a spectrum of Te3d5, O1s, Cd3d and C1s in Example 2 and Comparative Example 2 are shown in FIG. 8 and a spectrum of Cd MNN and Te MNN are shown in FIG. 9.

Referring to FIG. 6 and FIG. 8, at a peak observed at 571 to 574 eV of Te3d5, a large peak was observed in Example 1 and Example 2 compared to Comparative Example 1 and Comparative Example 2. In addition, at a peak observed at 532 eV of O1s, a small peak was observed in Example 1 and Example 2 compared to Comparative Example 1 and Comparative Example 2. From these results, it becomes clear that the oxygen content in an outer-most surface of a substrate in Example 1 and Example 2 is small and that this effects adhesion of an electrode.

A composition ratio of carbon (C), oxygen (O), cadmium (Cd) and tellurium (Te) in an outer-most surface of a substrate was calculated from the analysis results using an X-ray photoelectron spectroscopy method. The calculation results are shown in Table 1.

TABLE 1

|  | C | O | Cd | Te | Adhesion |
|---|---|---|---|---|---|
| Example 1 | 42.0 | 36.1 | 9.6 | 12.3 | ◯ |
| Example 2 | 39.0 | 38.9 | 7.7 | 14.4 | ◯ |
| Comparative Example 1 | 40.1 | 45.8 | 7.4 | 12.1 | X |
| Comparative Example 2 | 29.3 | 53.2 | 9.2 | 19.2 | X |

It became clear from Table 1 that because the oxygen content of an outer-most surface of a substrate before formation of an electrode measured using an X-ray photoelectron spectroscopy method is less than 40 atm %, sufficient adhesion of an electrode could be obtained.

According to the present invention, an UBM electrode structure body for a radiation detector and a radiation detector arranged with the UBM electrode structure body are provided for suppressing peeling and having high electrode adhesion. In addition, a manufacturing method of an UBM electrode structure body for a radiation detector and a manufacturing method of a radiation detector using the UBM electrode structure body are provided in which peeling does not occur during UBM structure formation, a solder jointing process or bonding of a signal line to a Pt layer.

What is claimed is:

1. A method of manufacturing an UBM electrode structure body for a radiation detector comprising:
   preparing a CdTe substrate or CdZnTe substrate;
   sequentially performing methanol washing and acetone washing of the CdTe substrate or the CdZnTe substrate;
   washing the CdTe substrate or the CdZnTe substrate using a solvent comprised from hydrocarbons with a carbon number of 9 or more and 12 or less and containing no hydroxyl group; and
   forming a Pt electrode layer by electroless plating,
   wherein the electroless plating is performed by immersing the CdTe substrate or the CdZnTe substrate in 0.01% by weight or more and 0.1% by weight or less of a chloroplatinic acid aqueous solution while stirring the chloroplatinic acid aqueous solution heated to 45° C. or more and 55° C. or less.

2. The method of manufacturing the UBM electrode structure body for a radiation detector according to claim 1, comprising: etching the CdTe substrate or the CdZnTe substrate with a bromine-methanol mixed solution or a bromine-bromic acid aqueous solution mixed solution, and forming the Pt electrode layer by the electroless plating.

3. The method of manufacturing the UBM electrode structure body for a radiation detector according to claim 1, further comprising: forming a Ni layer above the Pt electrode layer with respect to the CdTe substrate or the CdZnTe substrate, and further forming an Au layer above the Ni layer to form an electrode body having an UBM structure.

4. The method of manufacturing the UBM electrode structure body for a radiation detector according to claim 2, further comprising: forming a Ni layer above the Pt electrode layer with respect to the CdTe substrate or the CdZnTe substrate, and further forming an Au layer above the Ni layer to form an electrode body having an UBM structure.

5. A method of manufacturing the radiation detector comprising:
   cutting the CdTe substrate or the CdZnTe substrate including the UBM electrode structure body for a radiation detector manufactured by the manufacturing method according to claim 1 to a predetermined shape to form a radiation detection element; and
   connecting a detection circuit to the Pt electrode layer of the radiation detection element via a bump.

6. A method of manufacturing an UBM electrode structure body for a radiation detector comprising:
   preparing a CdTe substrate or CdZnTe substrate;
   sequentially performing methanol washing and acetone washing of the CdTe substrate or the CdZnTe substrate;
   washing the CdTe substrate or the CdZnTe substrate using a solvent comprised from hydrocarbons with a carbon number of 9 or more and 12 or less and containing no hydroxyl group; and
   forming a Pt electrode layer by electroless plating, wherein
   the CdTe substrate or the CdZnTe substrate includes impurities for controlling conductivity, and
   the electroless plating is performed by immersing the CdTe substrate or the CdZnTe substrate in 0.01% by weight or more and 0.1% by weight or less of a chloroplatinic acid aqueous solution while stirring the chloroplatinic acid aqueous solution heated to 45° C. or more and 55° C. or less.

7. The method of manufacturing the UBM electrode structure body for a radiation detector according to claim 6, comprising: etching the CdTe substrate or the CdZnTe substrate with a bromine-methanol mixed solution or a bromine-bromic acid aqueous solution mixed solution, and forming the Pt electrode layer by the electroless plating.

8. The method of manufacturing the UBM electrode structure body for a radiation detector according to claim 6, further comprising: forming a Ni layer above the Pt electrode layer with respect to the CdTe substrate or the CdZnTe substrate, and further forming an Au layer above the Ni layer to form an electrode body having an UBM structure.

9. The method of manufacturing the UBM electrode structure body for a radiation detector according to claim 7, further comprising: forming a Ni layer above the Pt electrode layer with respect to the CdTe substrate or the CdZnTe substrate, and further forming an Au layer above the Ni layer to form an electrode body having an UBM structure.

* * * * *